(12) United States Patent
Yancey

(10) Patent No.: US 6,464,741 B2
(45) Date of Patent: Oct. 15, 2002

(54) CMP POLISHING SLURRY DEWATERING AND RECONSTITUTION

(75) Inventor: Paul J. Yancey, Charlotte, NC (US)

(73) Assignee: Rodel Holdings Inc., WIlmington, DE (US)

( * ) Notice: Subject to any disclaimer, the term of this patent is extended or adjusted under 35 U.S.C. 154(b) by 0 days.

(21) Appl. No.: 10/081,706

(22) Filed: Feb. 21, 2002

(65) Prior Publication Data

US 2002/0124475 A1 Sep. 12, 2002

Related U.S. Application Data

(62) Division of application No. 09/847,907, filed on May 3, 2001, now Pat. No. 6,413,288, which is a division of application No. 09/413,083, filed on Oct. 6, 1999, now Pat. No. 6,241,586.

(60) Provisional application No. 60/103,283, filed on Oct. 6, 1998.

(51) Int. Cl.$^7$ .............................. C09K 3/14; C09G 1/02; C09G 1/04

(52) U.S. Cl. .............................. 51/309; 51/307; 51/308; 106/3

(58) Field of Search ........................... 51/307, 308, 309; 106/3; 438/692, 693

(56) References Cited

U.S. PATENT DOCUMENTS 4,786,325 A 11/1988 Melard et al.
5,389,352 A 2/1995 Wang
5,391,258 A 2/1995 Brancaleoni et al.
5,476,606 A 12/1995 Brancaleoni et al.
5,543,126 A 8/1996 Ota et al.
5,693,239 A 12/1997 Wang et al.
5,756,398 A 5/1998 Wang et al.
5,769,689 A 6/1998 Cossaboon
5,770,103 A 6/1998 Wang et al.
5,860,848 A 1/1999 Loncki et al.
5,932,486 A 8/1999 Cook et al.
5,951,724 A 9/1999 Hanawa et al.
6,001,269 A 12/1999 Sethuraman et al.
6,030,899 A 2/2000 Cook et al.
6,069,080 A 5/2000 James et al.
6,074,546 A 6/2000 Sun et al.
6,099,394 A 8/2000 James et al.
6,171,352 B1 1/2001 Lee et al.
6,241,586 B1 6/2001 Yancey
6,309,560 B1 10/2001 Kaufman et al.

FOREIGN PATENT DOCUMENTS

| EP | 1036632 A2 | 9/2000 |
|----|-----------|--------|
| WO | WO 9602319 A2 | 2/1996 |
| WO | WO 9638262 A1 | 12/1996 |
| WO | WO 9847661 A1 | 10/1998 |

Primary Examiner—Michael Marcheschi
(74) Attorney, Agent, or Firm—Gerald K. Kita; Konrad Kaeding; Kenneth A. Benson

(57) ABSTRACT

A method of making a slurry, by mixing a quantity of water with dissolvable constituents of an aqueous slurry used for polishing, with the dissolvable constituents being apportioned according to their desired per cent concentrations thereof in the aqueous slurry, and drying the mixture to obtain a reconstitutable slurry having solids of the dissolvable constituents.

6 Claims, 3 Drawing Sheets

CM P POLISHING SLURRY DEWATERING AND RECONSTITUTION

This application is a division of Ser. No. 09/847,907, filed May 3, 2001, U.S. Pat. No. 6,413,288 in turn, a division of Ser. No. 09/413,083 filed Oct. 6, 1999 U.S. Pat. No. 6,241,586 that claims the benefit of U.S. Provisional Application No. 60/103,283 filed Oct. 6, 1998.

BACKGROUND OF THE INVENTION

Polishing formulations for the chemical mechanical planarization (CMP) of integrated circuit wafers, as well as polishing compounds for high technology optical components typically consist of an aqueous dispersion of solids (the abrasives) combined with a variety of chemical constituents. Such commercial materials typically are sold in several parts, one containing the abrasive component in a concentrated form and the other part containing the chemical component(s) in a concentrated form. As the technology of CMP polishing has become more critical, complex chemical and abrasive systems have been developed. These aqueous formulations must exhibit long shelf life, and good stability so that the materials do not change while in storage, thus becoming useless for their intended purpose. For example, if a dispersion of solids is stored and the solids settle in the container to a hard or difficult to mix sediment, the dispersion is no longer readily usable by the customer.

Many attempts to make one component systems in which the chemical as well as the abrasive components are mixed in one liquid system have proven problematic. The problems occur because the presence of the chemical constituents is rarely conducive to forming stable solid dispersions, consequently the solids settle to the bottom of the container and require subsequent redispersion prior to use. This presents many problems to the end user. If the solids have settled into a difficult to redisperse sludge, the chances of utilizing all of the settled material are not good because it will stick to the container. Furthermore, shaking or stirring a large container such as a drum or tote is impractical.

The ideal concept would be to make a slurry exactly as the final end user would use it, and then "freeze it in time" so that it will be exactly as the end user wants it, three or even six months after the slurry is made. Since the main reason for instability is due to the aqueous dispersions that these slurries are sold as, it would be reasonable to assume that if one could eliminate the "aqueous" part of the system, the stability issues for both the chemical and abrasive constituents would be minimized.

SUMMARY OF THE INVENTION

A dry particulate solids composition comprised of a chemical-mechanical polishing slurry comprising submicron abrasive particles is provided which has had substantially all water removed therefrom and which may be reconstituted into a chemical-mechanical polishing slurry ready for use.

A method for chemical-mechanical polishing is provided comprising the steps of:
  a) providing a polishing pad;
  b) introducing a polishing fluid comprising submicron abrasive particles between said pad and a workpiece;
  c) producing relative motion between said pad and said workpiece; wherein said polishing fluid has been reconstituted from a dry particulate solids composition comprised of a chemical-mechanical polishing slurry comprising submicron abrasive particles which has had substantially all water removed therefrom.

In addition to submicron abrasive particles, the dry particulate solids composition of this invention may comprise an oxidizing agent, a complexing agent, a surface passivating agent, a surfactant, a dispersant, or any other type of compound used in slurries for chemical-mechanical polishing.

DESCRIPTION OF THE INVENTION

Figure 1:
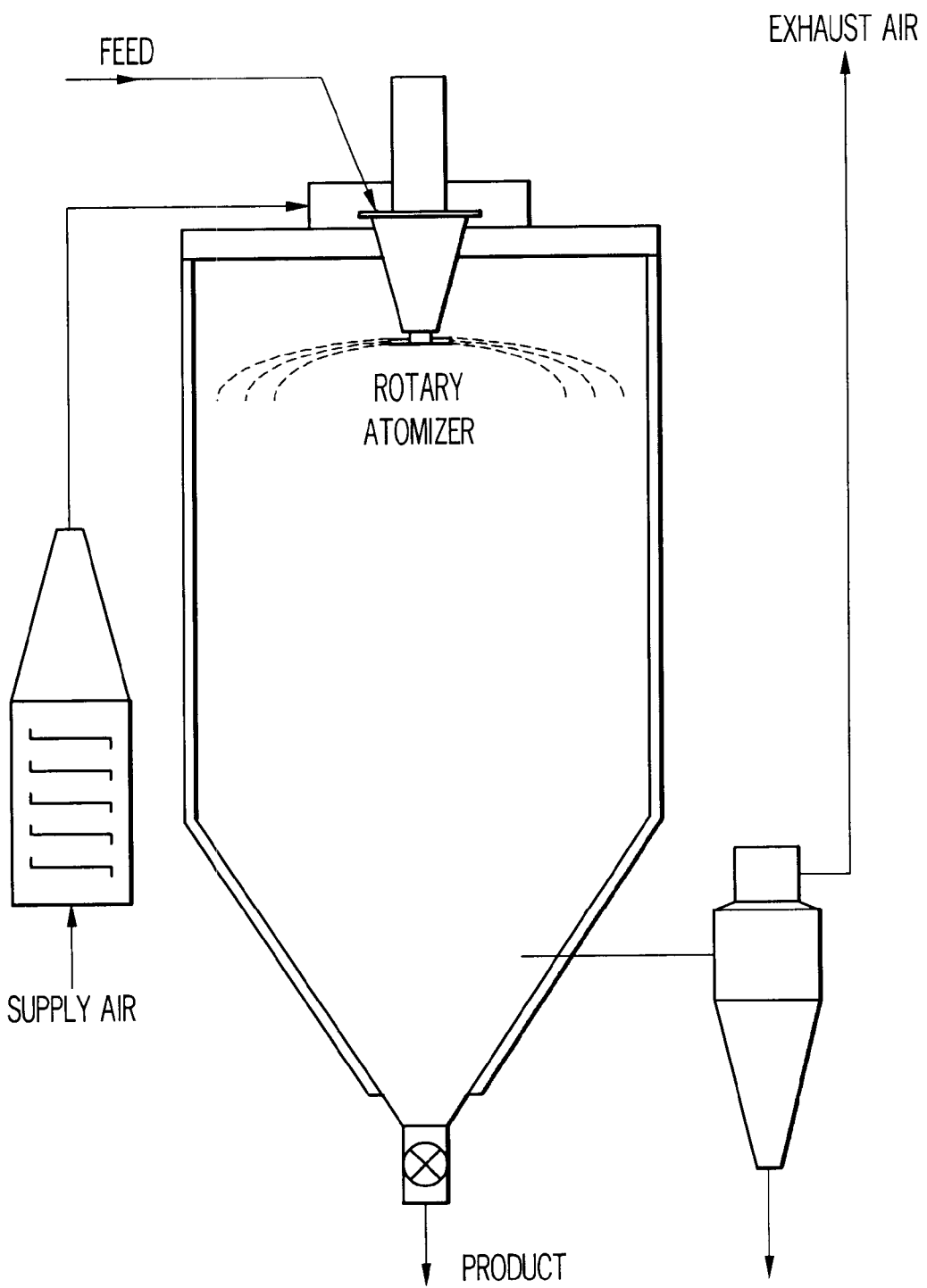
FIG. 1 is a schematic of a typical spray dryer.

This invention provides a means of preserving the exact abrasive and chemical ratios without the destabilizing and aging effects of aqueous dispersions. The abrasive and chemicals are mixed together as if they were being prepared for the end user's immediate use, or they are prepared as a concentrate with the ratios of the components being all related by a common multiple. Immediately after the polishing slurry is manufactured, it is dewatered by spray drying, freeze drying, or any number of drying or dewatering methods that exist. The resulting dried material, usually in the form of a flowable powder, can be packaged in conventional bags and stored indefinitely without degradation.

A further advantage brought about by this invention is that the weight of the product is reduced by as much as 70%–80%, which is a considerable cost savings when one considers shipment of liquid, aqueous slurry worldwide.

When the slurry is ready to be used, the end user may reconstitute the dried material by adding the required amount of water and dispersing with a high shear disperser. The resulting slurry is filtered and is ready for use in the CMP polishing operation.

The resulting polishing slurry does not acquire unwanted aggregates as one would expect. This is thought to be due to the complete and thorough dispersed state that the slurry is brought to just prior to drying. As the colloidially dispersed mixture of components dries, the abrasive grains are surrounded by the uniform presence of the drying dissolved salts, which in effect protect the abrasive particles from agglomerating with each other. As the salts are solvated during the reconstitution process, the abrasive particles are released in essentially the same state they existed prior to being dried.

Typical submicron abrasives used in chemical-mechanical polishing slurries are oxides such as alumina, silica, ceria, titania, germania, zirconia, and the like. Generally abrasive particles are used in slurries for CMP at about 1% to about 15% by weight. Preferred are alumina, silica, ceria, titania, or mixtures thereof at about 3% to 10% by weight.

Types of chemicals useful in CMP operations are oxidizing agents, chemical etchants, dispersing agents, surfactants, complexing agents, silica rate suppressing agents, passivating agents, silica protecting agents, buffers, and inhibitors, all of which may be present in the dried slurries of the present invention.

Commonly hydroxides, such as potassium hydroxide, ammonium hydroxide, and sodium hydroxide, and amines have been used as dispersing agents for CMP slurry abrasives. It has been found that a class of compounds known as amino alcohols may also be useful.

An oxidizing agent is usually a component of a chemical-mechanical polishing slurry to oxidize a metal layer to its corresponding oxide, such as oxidizing tungsten to tungsten oxide. The layer is mechanically polished to remove the tungsten oxide from the layer. Although a wide range of oxidizing components may be used, preferred components include oxidizing metal salts, oxidizing metal complexes, iron salts such as nitrates, sulfates, EDTA, citrates, potassium ferricyanide and the like, aluminum salts, sodium salts, potassium salts, ammonium salts, quaternary ammonium salts, phosphonium salts, peroxides, chlorates, perchlorates, permanganates, persulfates, iodates, and mixtures thereof. Typically, the oxidizing component is present in the slurry in an amount sufficient to ensure rapid oxidation of a metal layer while balancing the mechanical and chemical polishing components of the slurry. Oxidizing agents are typically present in a chemical-mechanical slurry from about 0.5% to 15% by weight, and preferably in a range from about 1% to 7% by weight.

Compositions of this invention may optionally further comprise compounds which act as complexing agents or chelating agents for $SiO_2$. These are described in great detail in U.S. Pat. No. 5,391,258 and U.S. Pat. No. 5,476,606. These compounds must have at least two acid groups present in the structure which can affect complexation to the silica. Acid species are defined as those functional groups having a dissociable proton. These include, but are not limited to, carboxyl, hydroxyl, sulfo and phospho groups. Carboxyl and hydroxyl groups are preferred as these are present in the widest variety of effective species. Particularly effective are structures which possess two or more carboxyl groups with hydroxyl groups in an alpha position, such as straight chain mono- and di-carboxylic acids and salts including, for example, malic acid and malates, tartaric acid and tartarates and gluconic acid and gluconates. Also effective are tri- and polycarboxylic acids and salts with secondary or tertiary hydroxyl groups in an alpha position relative to a carboxyl group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. These complexing agents may be used in slurries for CMP at about 0.1% to about 7% by weight. Preferably they are used at about 2% to about 4% by weight.

In addition the slurry composition may include a chemical etchant which is substantially free of metal ions. Typical etchants include persulfate salts, nitrate salts, sulfate salts, phosphate salts, citrate salts, oxalate salts, mixtures thereof, and the like. Preferably, the etchant is a non-metallic persulfate salt such as ammonium persulfate. The etchant facilitates the solubilization of the metal where the chemical mechanical polishing is taking place, thus allowing the metal to be dissolved in the aqueous dispersion. These chemicals are generally found in CMP slurries at about 1% to 10% by weight. Preferably they are used at about 2% to 7% by weight.

Often a chemical-mechanical polishing slurry will comprise a corrosion inhibitor which is substantially free of metal ions. Suitable corrosion inhibitors include benzotriazole (BTA), mercaptobenzothiazole (MBT), and other corrosion inhibitors typically used with metals such as copper which do not adversely affect the properties of the slurry. Typically corrosion inhibitors are present in chemical-mechanical polishing slurries at less than about 1% by weight. Preferably they are present in the range from about 0.05% to 0.6% by weight.

The first step in preparing dried slurry materials is to determine the exact ratio of all of the components in a polishing slurry as they exist at the time of use. Let us assume that the slurry we wish to reconstitute is a 5% solid abrasive and 7% chemical constituents, and that there are two chemical constituents. The total composition of a ready to use formulation may look similar to the following example:

| | |
|---|---|
| Solid Abrasive | 5% |
| Chemical A | 3% |
| Chemical B | 4% |
| Water | 88% |

After the water has been removed, the solids and dissolved solids will be left in the ratio of 5/3/4. In spray drying it is generally good to have the highest solids content possible, to reduce the amount of water that has to be evaporated, thus reducing the cost and increasing the throughput. Thus, when making a concentrate for drying, one should use the constituents in the ratio of 5/3/4 times some factor. This factor is typically determined by a solubility limit of one of the components, or a maximum solids loading limitation. Let us assume that Chemical B is only soluble to the maximum extent of 10%, then in order to make a completely homogeneous dispersion where all of the chemical components are dissolved, the maximum concentration factor would be 10%/4% or 2.5. Thus, the concentration of the components of the pre-dried slurry is determined by multiplying each component except the water by the factor 2.5. The final concentration for the drying slurry is:

| | |
|---|---|
| Solid Abrasive | 2.5 × 5 = 12.5% |
| Chemical A | 2.5 × 3 = 7.5% |
| Chemical B | 2.5 × 4 = 10.0% |
| Water | Balance 70.0% |

This formulation when dried will yield a dried material with the three active constituents having the ratio of 5/3/4 as in the ready to use slurry but by concentrating the spray dryer starting material, the spray drying operation is more efficient.

The drying technique can be one of many including spray drying, freeze drying, flash drying, vacuum drying, heated pan or conveyor drying, etc. The preferred one chosen for this invention is spray drying because it offers the most easily controlled final product with respect to particle size, % moisture, and reproducibility of product.

A spray dryer utilizes the combination of hot air circulating in a large tank into which a solid/liquid slurry is sprayed, either by rotary atomization or high pressure aspiration, into the heated air wherein the water content is almost immediately removed and a water-free solid particle is formed. As the particle progresses further in the air stream, the particle is further dried until it reaches its exit point in the chamber and is captured by a cyclone or collection container. A schematic of a typical spray dryer is shown in FIG. 1. In many dryers the coarser material is captured in a product collection container and the fines are collected in a cyclone separator. In the case of this invention, both collection methods are satisfactory as the size of the dried particle is not an issue.

The dried product is then transported to a storage hopper wherein enough spray dried material is collected to make a full lot. The collected product is then dry blended in a large double cone blender, or similar type, so that the dried powder lot is completely homogeneous. By blending a large lot dry, the size of the individual blended lot can be much larger than its liquid equivalent because the weight and volume of the water has been removed from the concentrate. A large homogeneous lot size is particularly important for the semiconductor industry, where each new lot of material must be checked prior to use.

After blending, the powder is packaged in any suitable type of container, such as a plastic lined fiber drum, or a plastic lined paper bag. It is desirable for the container size to be equivalent to the amount of dried material that is likely to be used in each polishing campaign after reconstitution.

Figure 2:
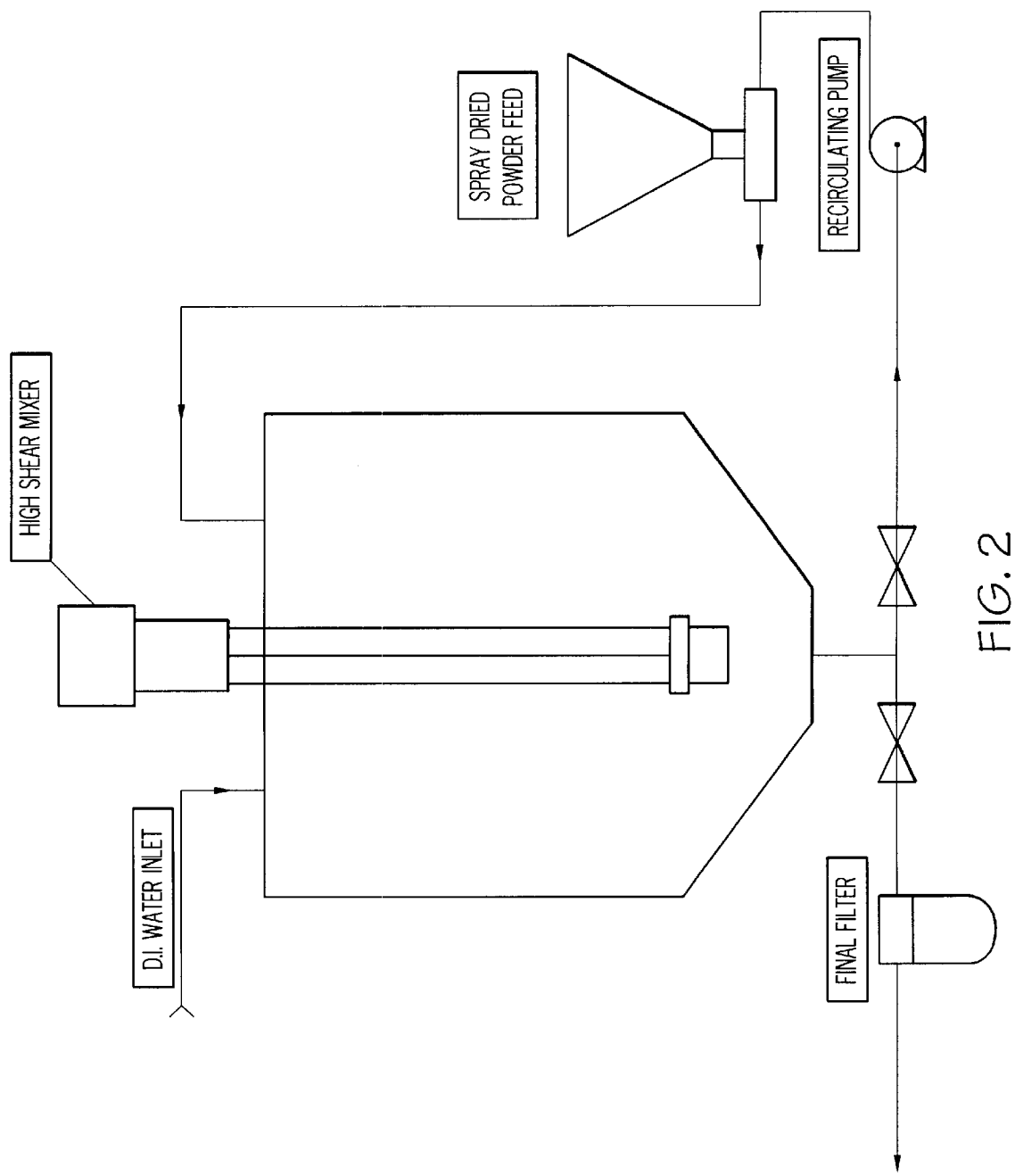
FIG. 2 is a schematic of a typical slurry reconstitution.

Reconstitution of the dried material may be carried out in a mixing unit as shown in FIG. 2. The equipment consists of a suitable means of introducing the measured amount of water and the powdered slurry. The mixer is a high speed rotor stator design capable of providing very high shear. After the reconstituted product has been mixed adequately (generally determined by how much energy per gallon has been expended on the product) the product is pumped from the reconstituting equipment through a sub-micron filter system and into a day tank. From the day tank, the product is recirculated and used by the end user in his polishing application.

It is in this last operation that the novelty and benefit of this invention is demonstrated. If the slurry is a two component system, the component containing the solids typically must be premixed to redistribute the solids in the container prior to dispensing into the day tank. If this is not done, the correct % solids in the final mixture will be incorrect. Similarly, the second component should be premixed to homogenize the solution prior to adding to the day tank. Both of these components generally require some type of metering, either by weight or volume, in addition to the metering of water in some concentrated systems. This mixture must then be filtered to remove any contamination from the operation.

In the case of this invention, no pre-mixing is required, because no settling or stability issues are involved. The powder is merely weighed (or pre-weighed for each size day tank), poured or educted into a tank containing the correct volume of water, and mixed. Upon completion of mixing, the final product is pumped through a filter to the day tank. In some cases, the day tank could be utilized as the mixing and dispersing vessel.

EXAMPLE 1

A slurry formulated for polishing copper in integrated circuit applications, Met410, was used as one example of this invention. This slurry typically has a very short shelf life as a one component slurry, and only a short (several weeks) as a two component slurry because several of the components react with one another. Another component is light sensitive in the liquid form. The drying of this slurry is further complicated by the fact that several of the salts are ammonia salts and easily decomposed by heat.

The Met410 slurry was prepared as a 2x concentrate to facilitate the spray drying operation. This represents a slurry that is twice as concentrated in each of the solids and dissolved solids as a slurry normally used for polishing. The ingredients of this predrying slurry were as follows:

| | |
|---|---|
| Phosphoric acid: | 11.2% |
| Ammonium Phosphate | 8.5% |
| Ammonium persulfate: | 8.5% |
| Organic corrosion inhibitor | 0.3% |
| Titanium dioxide | 9.9% |
| D.I. water | Balance |

The ingredients were mixed together and dispersed with a Hill rotor stator mixer until the temperature rise in the tank reached 10 degrees Celsius.

Within three days a portion of this material was spray dried in an APV Laboratory Spray Dryer having an electric air heater, a rotary atomizer, and a peristaltic feed pump with variable speed motor. See FIG. 1. The dried powder was collected from the bottom of the dryer as well as the cyclone separator. The atomizer was adjusted to prevent product from sticking on the walls of the dryer, and the inlet air temperature and feed rate were adjusted to obtain an outlet air temp of 80–85 degrees Celsius. The powder was sealed in a plastic bag awaiting further processing. The remaining slurry was stored in a closed container as a liquid awaiting further testing. The details of this spray drying test are listed in Table 1 below:

TABLE 1

| Test | Inlet Temp. (° C.) | Outlet Temp. (° C.) | Feed Rate (mL/min) | Atomizer speed (rpm) |
|---|---|---|---|---|
| I | 250–260 | 80–85 | 130 | 49000 |
| II | 180–185 | 80–85 | 65 | 41000 |

The two tests denote two different inlet temperatures at which the dryer was operated to determine if inlet temperature had an effect on the decomposition of volatile or heat sensitive components.

Another means of monitoring the usefulness of this invention is in the analytical determination of the primary active ingredient in the slurry, the ammonium persulfate. This component is both sensitive to heat and to light in the aqueous state. The two dried slurries and the concentrate from which they came were analyzed one week after the spray drying was performed. The results are shown in Table 2 below. All concentrations were made in the ready to use concentration.

From Table 2 it can be seen that the spray drying preserves the efficacy of the least stable chemical component. Even within ten days of its manufacture, the strength of the oxidizing component, ammonium persulfate, was decreasing within the single part slurry concentrate.

TABLE 2

| Slurry | % persulfate | pH | median particle size | mean particle size |
|---|---|---|---|---|
| Reconstituted test I | 4.34 | 2.3 | 0.178 | 0.233 |
| Diluted liquid con-Centrate, 10 d. old | 4.17 | 2.3 | 0.177 | 0.225 |
| Reconstituted test II | 4.33 | 2.3 | 0.178 | 0.227 |

Figure 3:
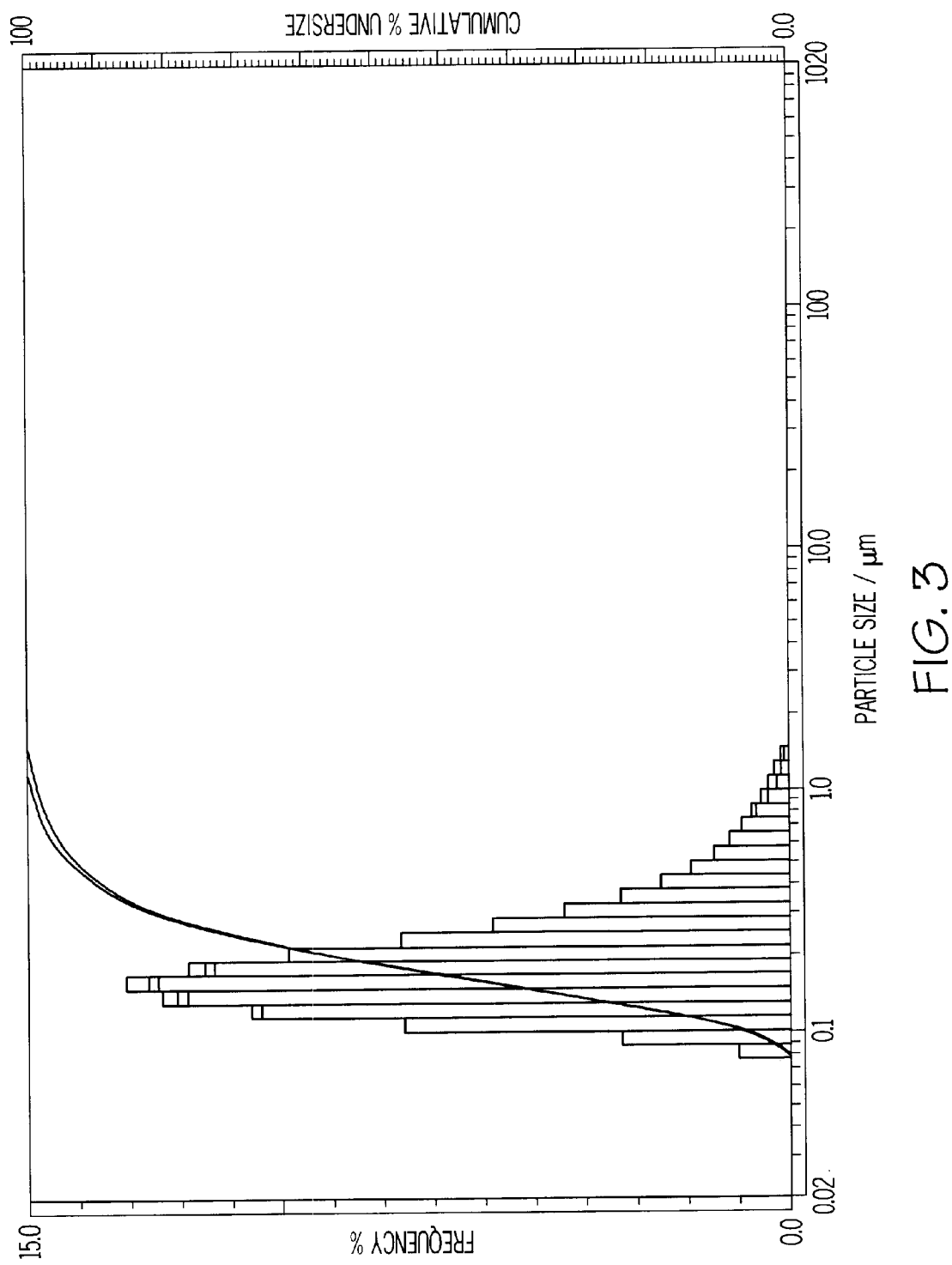
FIG. 3 is a comparison of particle size distribution for three slurries of Example 1.

It can be seen from the data in Table 2 that the persulfate concentration did not change with increased inlet temperature and remained exactly as it was intended in the original composition. The particle size of the two dried materials came back to exactly what they had been before the drying operation. The graphical depiction of the comparison of particle size distributions of the predrying concentrate, and the two reconstituted test slurries is shown in FIG. 3. The three materials are so close that the three distributions appear to be one.

Six weeks after spray drying, polishing tests were performed on the pre-drying slurry concentrate and the dried slurry sample Test I of the Met410 slurry. The final concentrations of these slurries were adjusted to the following levels:

| | |
|---|---|
| Phosphoric acid: | 5.6% |
| Ammonium Phosphate | 4.3% |
| Ammonium persulfate: | 4.3% |
| Organic corrosion inhibitor | 0.15% |
| Titanium dioxide | 4.9% |
| D.I. water | Balance |

The spray dried slurry was measured out to obtain the above concentration and dispersed in a Hill rotor stator mixer to a delta T of 10 degrees Celsius. The residual six week old concentrated slurry was diluted approximately 1 part concentrate to 1 part water to get the exact concentration noted above and mixed with a propeller mixer. All slurries were filtered through a 1 micron bag filter.

Six inch diameter copper film wafers were polished with each of the three slurries using a Strasbaugh 6EC Wafer Polisher at identical polishing parameters. Also polished were silicon dioxide film wafers to establish the relative polishing rate between copper and silicon dioxide known as the oxide selectivity. The results of these tests are shown in Table 3. The polishing rates are listed in Angstroms per minute (A/m):

TABLE 3

| Slurry Origin | Copper Removal Rate | Selectivity to Oxide |
|---|---|---|
| Predrying concentrate, diluted to use conc. | 2200 A/min | 26:1 Cu:Oxide rate |
| Spray dried reconstituted slurry #I | 7049 A/min | 63:1 Cu:Oxide rate |

Typical removal rates for Met410 slurry are 6000 to 7000 A/min. The six week old concentrate had deteriorated considerably during that time as a one component mixture.

The spray dried material had preserved the characteristics of the commercial two part slurry.

EXAMPLE 2

The second spray dried material known as Test II above was tested in a copper wafer polishing comparison nine weeks after it was dried. The test was run as a comparison of the reconstituted Test II material and a freshly mixed Met410 slurry. The polishing was performed in essentially the same manner as before. The concentrations of the two slurries were made up to the end use concentration shown above. Results of the polishing tests are shown in Table 4 below:

TABLE 4

| Slurry Origin | Copper Removal Rate | Selectivity to Oxide |
|---|---|---|
| Fresh Met410 slurry | 6100 A/min | 36:1 Cu:Oxide rate |
| Spray dried reconstituted slurry #II | 6600 A/min | 66:1 Cu:Oxide rate |

The surface finish of these wafers was also studied. There appeared to be no noticeable difference in surface scratching between the two slurries.

EXAMPLE 3

A concentrate identical to the pre-drying concentrate of examples 1 and 2 was prepared in the same manner in preparation for another spray dryer test.

Within three days a portion of this material was spray dried in an Niro Production Minor Spray Dryer having an electric air heater, a rotary atomizer, and a Moyno feed pump with a variable speed motor. All of the dried powder was collected from the cyclone separator. The atomizer was adjusted to prevent product from sticking on the walls of the dryer, and the inlet air temperature and feed rate were adjusted to obtain an outlet air temp of 100 degrees Celsius. The powder was sealed in a plastic bag awaiting further processing. The remaining slurry was stored in a closed container as a liquid awaiting further testing.

Several weeks later polishing tests were performed on the pre-drying concentrate slurry of example 3 and dried slurry samples as well as a commercial two part version of the Met410 slurry. The final concentrations of all three slurries were adjusted to the following levels:

| | |
|---|---|
| Phosphoric acid: | 5.6% |
| Ammonium Phosphate | 4.3% |
| Ammonium persulfate: | 4.3% |
| Organic corrosion inhibitor | 0.15% |
| Titanium dioxide | 4.9% |
| D.I. water | Balance |

The spray dried slurry was measured out to obtain the above concentration and dispersed in a Hill rotor stator mixer to a delta T of 10 degrees Celsius. The residual concentrated slurry from the spray drying tests was diluted approximately 1 part concentrate to 1 part water to get the exact concentration noted above and mixed with a propeller mixer. The commercial slurry was made by mixing Part A and Part B together (to obtain the above concentrations) and mixing with a propeller mixer. All slurries were filtered through a 1 micron bag filter.

Six inch diameter copper film wafers were polished with each of the three slurries using a Strasbaugh 6EC Wafer Polisher at identical polishing parameters. The results of these tests are shown in Table 5.

TABLE 5

| Slurry Origin | Copper Removal Rate |
|---|---|
| Fresh Met410 slurry | 6960 A/min |
| Spray dried reconstituted slurry from Niro Tests | 6333 A/min |
| Predrying concentrate, diluted to use concentration (2 wks old) | 4994 A/min |

Microscopic examination of these test wafers showed that the surface condition of the freshly made commercial slurry was better than the spray dried and reconstituted slurry in this case. The reason for this discrepancy is unknown.

EXAMPLE 4

A Niro Mobile Minor Type H spray dryer was used in this example. This dryer was operated in a similar manner to the other examples. The polishing slurry in this example is used for polishing tungsten. The proprietary slurry s a ready to use formulation had the following constituents:

| | |
|---|---|
| Carboxylic acid | 3% |
| Carboxylic acid salt | 0.3% |
| Oxidizing component | 6% |
| Abrasive | 9% |
| D.I. Water | Balance |

A concentrate of this slurry was prepared for spray drying by doubling the concentrations of the chemical and abrasive components. The concentrate was then spray dried at several outlet temperature values to determine the degradation, if any, of the carboxylic acid components. The outlet temperature was varied by changing the feed rate of the concentrate and leaving all other parameters constant.

The dry flowable powders were reconstituted to the ready to use slurry composition shown above, and used to polish tungsten film wafers and thermal oxide film wafers. A portion of the original concentrate used to make the powders was also diluted to the ready-to-use concentration and used as the baseline. Table 6 below shows the results of the spray drying and polishing tests:

TABLE 6

| | Tungsten rate | Selectivity to ox. |
|---|---|---|
| Diluted concentrate from spray drying run | 2344 A/min | 416:1 |
| Freshly made slurry | 2177 A/min | 386:1 |
| Reconstituted spray dried powder | 2328 A/min | 346:1 |

Microscopic examination of the surfaces of the oxide film wafers after polishing showed no difference in scratching between any of the test wafers.

Although the examples above report the use of this invention with chemical mechanical polishing slurries for integrated surface applications, the value of this invention in other types of polishing formulations is obvious also. For example, many polishing compounds containing abrasives and chemicals, added to provide enhanced removal rates or special surface conditions, could be dried in a similar manner and reconstituted at the point of use. Abrasive slurries such as this are used for polishing specialty optics, for polishes involving semiconductor substrates such as silicon and gallium arsenide, for plastic eyeglass and contact lenses and other similar technologies.

What is claimed is:

1. A method of making a polishing slurry, comprising the steps of:

providing a mixture by mixing a quantity of water with dissolvable polishing chemical constituents of a preformed aqueous polishing slurry, wherein the dissolvable polishing chemical constituents are apportioned according to the desired per cent concentrations thereof in the preformed aqueous polishing slurry;

drying the mixture to obtain a dried mixture of a reconstitutable slurry having solids of the dissolvable polishing chemical constituents; and reconstituting the dried mixture to provide a final aqueous polishing slurry by dissolving the solids of the dissolvable polishing chemical constituents in an amount of water apportioned according to a desired per cent concentration of the amount of water in the final aqueous polishing slurry.

2. The method according to claim 1 wherein, the step of mixing a quantity of water with dissolvable polishing chemical constituents of the preformed aqueous polishing slurry further comprises the step of; mixing the quantity of water with a concentrate of the dissolvable polishing chemical constituents.

3. The method according to claim 1 wherein, the step of mixing a quantity of water with dissolvable polishing chemical constituents of the preformed aqueous polishing slurry further composes the step of; mixing the quantity of water with a concentrate of the dissolvable polishing chemical constituents at the maximum solubility of one of the dissolvable polishing chemical constituents in the quantity of water.

4. The method according to claim 1 wherein, the step of drying the mixture comprises the step of; spray drying the mixture to preserve any of the dissolvable constituents from dissipation.

5. The method according to claim 1, further comprising the steps of: providing the mixture with abrasive grains apportioned according to the desired per cent concentrations in the preformed aqueous polishing slurry, and drying the mixture to obtain the reconstitutable slurry having the abrasive grains surrounded by the solids of the dissolvable polishing chemical constituents.

6. The method according to claim 1 wherein, the step of drying the mixture to obtain a reconstitutable slurry, further comprises the step of; drying the mixture to obtain dry homogenized dissolvable solids of the polishing chemical constituents of the preformed aqueous polishing slurry, with the homogenized dissolvable solids of the polishing chemical constituents being apportioned according to the desired per cent concentrations thereof in the final aqueous polishing slurry.

* * * * *